US011837994B2

(12) United States Patent
Hernandez Martinez

(10) Patent No.: US 11,837,994 B2
(45) Date of Patent: Dec. 5, 2023

(54) DIAGNOSTIC MODULE OF A PHOTOVOLTAIC PANEL

(71) Applicant: Bhishma Hernandez Martinez, Cirujales del Rio (ES)

(72) Inventor: Bhishma Hernandez Martinez, Cirujales del Rio (ES)

( * ) Notice: Subject to any disclaimer, the term of this patent is extended or adjusted under 35 U.S.C. 154(b) by 66 days.

(21) Appl. No.: 17/599,155

(22) PCT Filed: Mar. 28, 2019

(86) PCT No.: PCT/ES2019/070210
§ 371 (c)(1),
(2) Date: Sep. 28, 2021

(87) PCT Pub. No.: WO2020/193820
PCT Pub. Date: Oct. 1, 2020

(65) Prior Publication Data
US 2022/0173696 A1    Jun. 2, 2022

(51) Int. Cl.
*H02S 50/10* (2014.01)
*G01R 31/40* (2020.01)

(52) U.S. Cl.
CPC .............. *H02S 50/10* (2014.12); *G01R 31/40* (2013.01)

(58) Field of Classification Search
CPC . H02S 50/10; G01R 31/40; G06F 1/28; G06F 1/30

(Continued)

(56) References Cited

U.S. PATENT DOCUMENTS 8,324,921 B2 * 12/2012 Adest .................. H02S 50/10
324/761.01
2008/0147335 A1    6/2008 Adest et al.
(Continued)

FOREIGN PATENT DOCUMENTS

ES    2382647 A1 *  6/2012  ............. H02S 50/10
ES    2382647 A1     6/2012
(Continued)

OTHER PUBLICATIONS

O. Alonso, "Cascaded H-Bridge Multilevel Converter for Grid Connected Photovoltaic Generators with Independent Maximum Power Point Tracking of each Solar Array", Article, 2003, 1-5, IEEE Annual Power Electronics Specialists Conference.

*Primary Examiner* — Giovanni Astacio-Oquendo
(74) *Attorney, Agent, or Firm* — Hayes Soloway PC

(57) ABSTRACT

The invention relates to a module for the diagnosis of a single photovoltaic panel, which comprises a first connection for input wiring coming from a photovoltaic solar panel, a second connection for output wiring through which at least the energy from the photovoltaic panel exits, a measurement means for measuring the voltage and current coming from the photovoltaic solar panel, through input wiring coming from a photovoltaic panel, a control logic and communication means. Thanks to this module associated with each of the panels, it is possible to avoid manual supervision of each and every one of the panels, to eliminate the impossibility of detecting malfunctioning or operation outside the maximum power point of the panels, to overcome the difficulty in evacuating the direct current and to avoid production and efficiency losses of the photovoltaic solar installations.

6 Claims, 3 Drawing Sheets

(58) Field of Classification Search
USPC .................................. 324/764.01, 537, 500
See application file for complete search history.

(56) References Cited

U.S. PATENT DOCUMENTS

| | | |
|---|---|---|
| 2011/0066401 A1 | 3/2011 | Yang et al. |
| 2012/0316802 A1* | 12/2012 | Presher, Jr. ............ H02J 3/381 |
| | | 702/58 |
| 2015/0084663 A1* | 3/2015 | Wirsing ................. G01R 31/40 |
| | | 324/761.01 |
| 2015/0101650 A1* | 4/2015 | Dhere .................... H02S 50/10 |
| | | 136/244 |
| 2016/0079916 A1* | 3/2016 | Adest ................. H02M 3/1582 |
| | | 324/761.01 |
| 2019/0326854 A1* | 10/2019 | Adest ...................... H02M 3/10 |

FOREIGN PATENT DOCUMENTS

| | | |
|---|---|---|
| ES | 2533317 A1 | 4/2015 |
| ES | 2692399 T3 | 12/2018 |
| JP | 2015-104266 A | 6/2015 |
| JP | 2015-521460 A | 7/2015 |

\* cited by examiner

DIAGNOSTIC MODULE OF A PHOTOVOLTAIC PANEL

CROSS-REFERENCE TO RELATED APPLICATIONS AND PRIORITY

This patent application claims priority from PCT Patent Application No. PCT/ES2019/070210 filed Mar. 28, 2019. This patent application is herein incorporated by reference in its entirety.

OBJECT OF THE INVENTION

The object of the present invention, as the title of the invention establishes, is a diagnostic module of a photovoltaic panel, i.e., it relates to a device that performs the function of diagnosing the condition of a photovoltaic panel. In a complementary manner, each module can also have functionalities for transmitting to a central or management unit, wherein, also in a complementary manner, said central unit can furthermore have supervision and/or remote control functions, the functionality of the diagnostic module of the invention not being limited due to the presence or not of a central module and the functionalities that this central module may have.

Another object of the present invention is a photovoltaic solar installation that has in each of the solar panels thereof a diagnostic module such as the one that is object of the invention.

The present invention is characterised by the fact that the diagnostic module object of the invention has been exclusively intended for the diagnosis and supervision of a single photovoltaic panel, such that if it is applied to a multiplicity of photovoltaic panels, individual supervision and diagnosis of each panel is achieved.

Therefore, the present invention falls within the field of photovoltaic solar installations and, in particular, among the supervision means.

BACKGROUND OF THE INVENTION

The number of photovoltaic solar energy installations has been increasing in recent years. The amount of photovoltaic solar panels used in these installations is also increasing. The management and maintenance of a large[number of photovoltaic solar panels is critical to ensure that the installations have adequate production.

The market trend is to concentrate all photovoltaic generation systems in single devices that are capable of handling ever greater power. Direct voltage to alternating voltage converters are capable of handling a large number of photovoltaic solar panels at the same time, as well as providing information to the user about the overall production of the photovoltaic solar production installations.

In current photovoltaic solar energy installations, it is not possible to individually collect information at the level of each photovoltaic solar panel. This implies that in order to carry out control and maintenance, it must be done through a periodic manual process, one by one, panel by panel. Thus, photovoltaic solar panels that may be potentially malfunctioning, those that may be deteriorated in terms of power production and those that need to be replaced are manually detected.

There are also situations wherein after manual supervision of each and every one of the panels in an installation, no panels have been detected that, although apparently not damaged, are not correctly configured at the maximum power point. This is due to the fact that current systems do not distinguish between a power point that is a local maximum and an overall maximum. Because of this, depending on environmental conditions, they could be being configured in the wrong manner.

Furthermore, the current trend in photovoltaic solar panel installations is to put many panels connected in series, which in turn can further be connected to other branches of panels in parallel. Configurations of this type wherein a large number of photovoltaic solar panels are involved causes the diagnosis of the detailed condition of an installation to be very complex. In the event that one of the panels connected in series in a branch of the installation fails, the production of the rest of the panels connected in series to the same branch is affected, resulting in a loss of production and therefore of the efficiency of the installation.

In addition, a DC/AG inverter is responsible for transforming the direct voltage generated by the photovoltaic solar panels into the alternating voltage that the transmission and distribution network has. Solar panel clusters today are communalised and connected to a single DC/AC inverter. This situation makes handling the maximum power point thereof inefficient. Typically, the maximum power point corresponding to the entire installation is used as the maximum power point, not the ideal maximum power point of each of the panels separately. Currently, it happens that the overall production of the system at the maximum power point is lower than the production of each of the photovoltaic solar panels if they were configured separately.

Therefore, the object of the present invention is to overcome the aforementioned problems, specifically:
- How expensive and laborious it is to manually supervise each and every one of the panels of a photovoltaic panel installation.
- The impossibility of detecting malfunctioning or operation outside the maximum power point of any of the panels with the currently existing means.
- The difficulty in evacuating the direct current.
- The production and efficiency losses of the installations due to the fact that the production at the maximum power point of a group of panels is lower than the sum of the productions of a group of panels, each of them working at the maximum power point.

In order to overcome said difficulties, a diagnostic module for a photovoltaic panel has been developed such as the one described below and is reflected in its essence in the first claim.

DESCRIPTION OF THE INVENTION

The object of the present invention is a diagnostic module of a photovoltaic panel, i.e., it is specifically intended for an individualized photovoltaic panel and not for the diagnosis of a communalised cluster of panels, in which case each of the panels has its own diagnostic device.

The module is an electronic device that is used to manage and perform measurements of photovoltaic solar panels independently and autonomously. The module is connected as close as possible to the photovoltaic solar panels and has the ability to obtain individual information from the same, manage it and send information on the condition thereof to other control systems that may also be connected to the same network.

The module performs voltage and current measurements of a single panel and can send the obtained results to other devices. It can also conveniently control the current generated by the photovoltaic solar panel to perform the necessary measurements or diagnoses.

The voltage and current measurements performed in the different modules of a photovoltaic solar installation can be sent to a central system and used to make decisions at the photovoltaic solar generation installation level.

Furthermore, in a complementary manner, it can perform power management and optimisation operations on the photovoltaic solar module itself and, also in a complementary manner to this last embodiment, it can have means for converting the generated direct voltage into alternating voltage.

Therefore, since the diagnostic module is conceived and intended for a single photovoltaic panel, the supervision and diagnosis of each photovoltaic panel is achieved individually and, moreover, as a consequence of all this, a total control system of a photovoltaic solar installation is achieved.

The advantages of the diagnostic module object of the application with respect to other solutions are:
Ability to individually diagnose each photovoltaic solar panel.
Ability to individually manage each photovoltaic solar panel. Improvement of the location of the maximum power point, as it is done individually for each of the panels.
Provides information about the photovoltaic solar panel to the outside.
Simplifies the scalability of photovoltaic solar energy generation installations.
Simplifies the connection configurations of photovoltaic solar panels with other photovoltaic solar panels.
Reduces the verification times of photovoltaic solar panel installations, verification which is currently done manually.
Gives access to information at the photovoltaic solar panel level, to other more complex processing systems and decision-making.
The information it provides can be remotely monitored, managed and/or controlled.

Except when indicated otherwise, all of the technical and scientific elements used in this specification have the meaning commonly understood by a person with average skill in the art to which this invention belongs. When this invention is put into practice, methods and materials may be used that are similar or equivalent to the ones described in this specification.

Throughout the description and in the claims, the word "comprises" and its variants are not intended to exclude other technical features, additives, components or steps. For those skilled in the art, other objects, advantages and features of the invention may be deduced from both the description and the practical use of the invention.

DESCRIPTION OF THE FIGURES

As a complement to the present description, and for the purpose of helping to make the features of the invention more readily understandable, in accordance with a preferred practical exemplary embodiment thereof, said description is accompanied by a set of drawings constituting an integral part of the same, which by way of illustration and not limitation represent the following.

PREFERRED EMBODIMENT OF THE INVENTION

With reference to the figures, a preferred embodiment of the invention proposed is described below.

Figure 1:
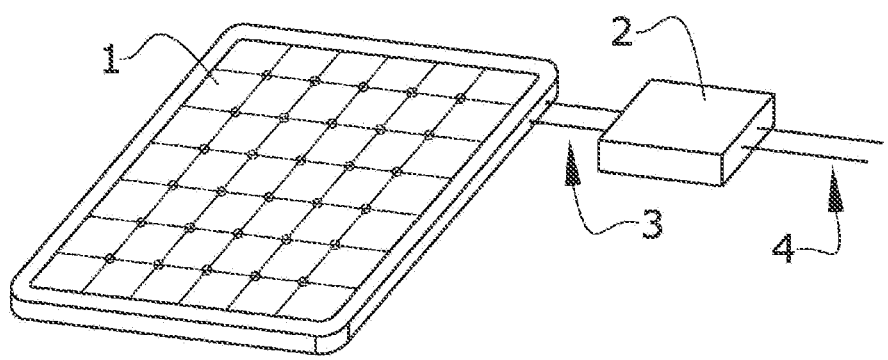
FIG. 1 shows a general representation of a photovoltaic panel to which a diagnostic module such as the one that is object of the invention has been connected.

FIG. 1 shows a photovoltaic panel (1) to which a diagnostic module (2) such as the one that is object of the application has been connected, a connection that has been performed through an output wiring group (3) of the photovoltaic panel and that is used to instantaneously measure the voltage and current generated by the diagnostic module (2).

The diagnostic module (2) has at least one output wiring group (4) through which the energy from the photovoltaic panel exits.

Figure 2:
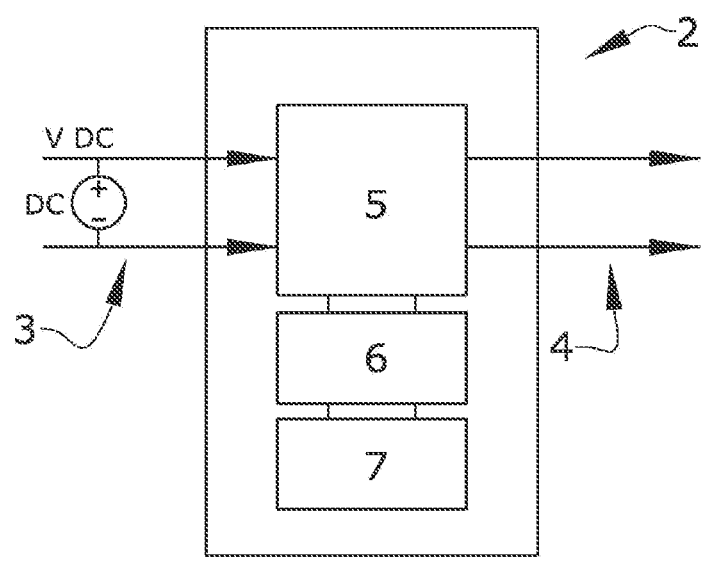
FIG. 2 shows a first embodiment of the diagnostic module in the most basic embodiment thereof.

Each diagnostic module is intended for the supervision and diagnosis of a single photovoltaic panel and, as FIG. 2 shows, in the simplest embodiment thereof it comprises:
Measurement means (5) for measuring the voltage and current coming from the photovoltaic solar panel.
A control logic (7) may be:
A microcontroller,
an FPGA, an ASIC,
or an external control logic that manages the diagnostic module thanks to the communication system.
Communication means (6). There can be several types:
Based on communication over the power wire itself.
Based on communications over an independent data wire.
Based on wireless communications.

The diagnosis of each of the panels can be performed hi an integral manner with the diagnosis module itself by means of the control logic (7) that performs the diagnosis of the panel, or by means of a centralised processing system, which can perform a more complex diagnosis at the photovoltaic solar installation level with the information transmitted from other modules by using the measurements taken and transmitted by the different modules connected to the same.

Figure 3:
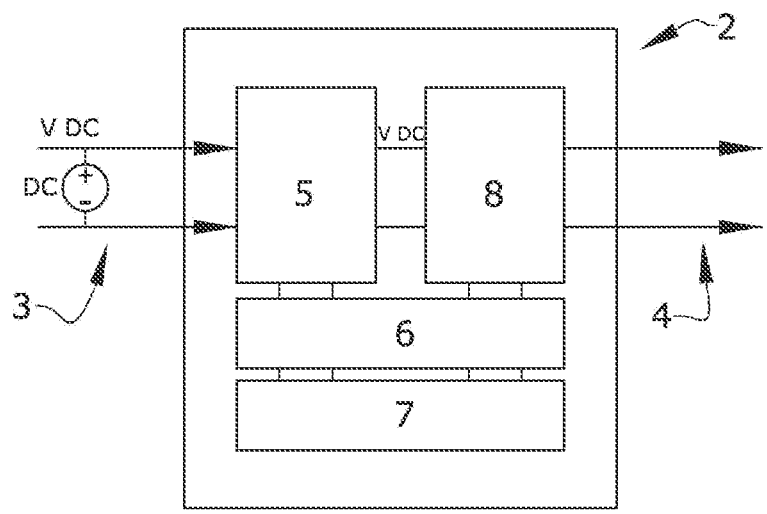
FIG. 3 shows an embodiment complementary of the previous one which enables the energy generated to be optimised by having means to bring the panel to the maximum power point.

FIG. 3 shows a complementary embodiment that improves the previous embodiment and to which means for optimising the power generated (8) by the photovoltaic panel have been added and which are responsible for finding the maximum power point of the panel.

Figure 4:
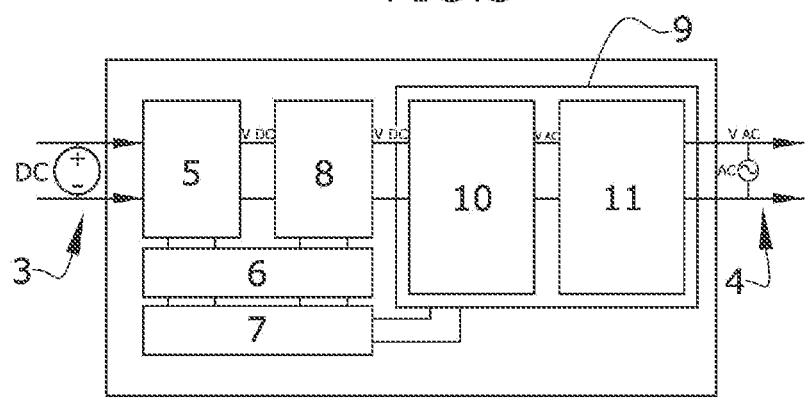
FIG. 4 shows a complementary embodiment of the previous ones in which the module has a system for converting direct voltage to alternating voltage.

FIG. 4 shows a more complete embodiment that can be added both to the embodiment shown in FIG. 2 and to the one shown in the embodiment of FIG. 3, and which in the case shown consists of arranging means for managing the power (9) at the output of the means for optimising the power generated (8), means for managing the power which in turn first comprise an inverter (10) at the output of which protection means (11) are arranged.

These means for managing the power (9), among other functions, aim to transform the direct current energy generated by the photovoltaic panel into alternating current energy, which facilitates the connection of all the photovoltaic panels to one same conductor wire, avoiding having to wire from each photovoltaic panel to the group inverter, which entails more than considerable savings in wiring in a photovoltaic solar installation.

Figure 5:
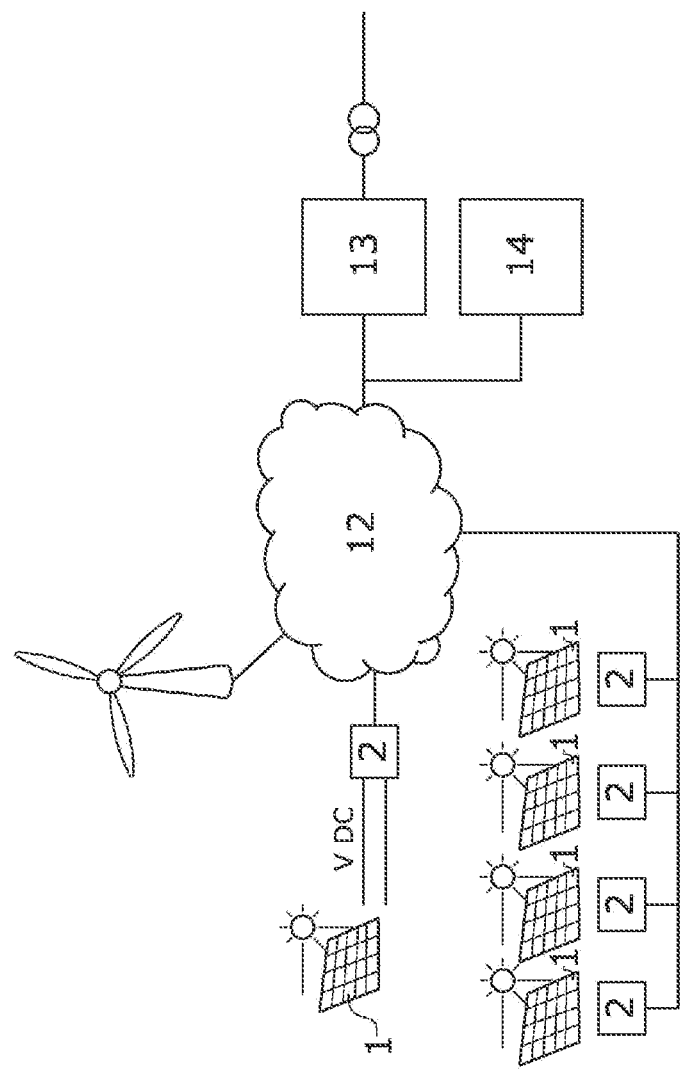
FIG. 5 shows a representation of a system comprising a plurality of photovoltaic panels connected to a centralizind system, wherein each of the photovoltaic panels has a diagnostic device associated.

FIG. 5 shows a representation of a system that would be carried out if the user considers it necessary, wherein it is observed that each of the photovoltaic panels (1) has the associated diagnostic device (2) thereof and in turn, all of them are connected to a centralising system (12) with multiple electrical energy sources to subsequently be connected to an energy controller (13). It could in turn be associated with a communication, management, supervision and/or control system (14).

It should be clear that the diagnostic module of a photovoltaic panel object of the invention does not require a central control system to operate, the latter being optional and would only be used to obtain data from each of the individual diagnostic modules if necessary.

Having thus adequately described the nature of the present invention, as well as how to put it into practice, it must be noted that, within its essential nature, the invention may be carried out according to other embodiments differing in detail from that set out by way of example, which the protection sought would equally cover, provided that the fundamental principle thereof is not altered, changed or modified.

The invention claimed is:

1. A diagnostic module of a photovoltaic panel for the diagnosis of a single photovoltaic panel in an individualised, independent and autonomous manner, the diagnostic module comprising:
   an input connection aimed to connect to the photovoltaic solar panel thereby receiving energy coming from the photovoltaic panel;
   an output connection associated to the input connection such that at least the energy from the photovoltaic panel exits through the output connection;
   measurement module, connected between the input connection and the output connection, that measures a current-voltage characteristic curve of the photovoltaic solar panel;
   a control logic, associated to the measurer ent module, that controls the current generated by the photovoltaic panel and performs a diagnosis of the photovoltaic panel based on the current-voltage characteristic curve; and
   communication module associated to the control logic.

2. The diagnostic module of claim 1, wherein the control logic is selected from:
   a microcontroller,
   an FPGA,
   an ASIC, and
   a control logic that manages the diagnostic module using the communication module.

3. The diagnostic module of claim 1, wherein the communication module additionally comprise an element selected from:
   a connection to the output connection,
   an independent data transfer wire,
   a wireless communications unit, and
   a combination of one or more of the foregoing.

4. The diagnostic module of claim 1, additionally comprising a module for optimising power generated by the photovoltaic panel, connected between the measurement module and the output connection.

5. The diagnostic module of claim 4, wherein it additionally comprises a module for managing power, which in turn comprise an inverter connected to the module for optimising power generated and protection module, connected to the inverter.

6. A photovoltaic solar installation comprising an assembly of photovoltaic panels and wherein each of the photovoltaic panels is associated to a diagnostic module according to claim 1, wherein the diagnostic modules are connected to a centralising system, the centralising system being connected in turn to an energy controller and to a communication and control system.

* * * * *